(12) United States Patent
Kim et al.

(10) Patent No.: US 10,522,683 B2
(45) Date of Patent: Dec. 31, 2019

(54) TRANSISTORS WITH BALLISTIC OR QUASI-BALLISTIC CARRIER BEHAVIOR AND LOW RESISTANCE IN SOURCE AND DRAIN NODES

(71) Applicant: INTEL CORPORATION, Santa Clara, CA (US)

(72) Inventors: Raseong Kim, Portland, OR (US); Uygar Avci, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/962,634

(22) Filed: Apr. 25, 2018

(65) Prior Publication Data
US 2019/0334026 A1    Oct. 31, 2019

(51) Int. Cl.
| | | |
|---|---|---|
| H01L 29/78 | (2006.01) |
| H01L 29/417 | (2006.01) |
| H01L 29/66 | (2006.01) |
| H01L 29/16 | (2006.01) |
| H01L 21/285 | (2006.01) |
| H01L 21/768 | (2006.01) |
| H01L 21/02 | (2006.01) |

(52) U.S. Cl.
CPC ...... *H01L 29/785* (2013.01); *H01L 29/41791* (2013.01); *H01L 29/6656* (2013.01); *H01L 29/66795* (2013.01); *H01L 21/02532* (2013.01); *H01L 21/28518* (2013.01); *H01L 21/76843* (2013.01); *H01L 29/16* (2013.01)

(58) Field of Classification Search
CPC ............. H01L 29/785; H01L 29/41791; H01L 29/6656; H01L 29/66795; H01L 29/16; H01L 21/76843; H01L 21/02532; H01L 21/28518

USPC ........ 257/401, 338, 344, 383, 623, E29.022, 257/E29.117, E29.137, E29.147, E29.296, 257/E29.297, E21.429, E21.431, E21.661; 438/142, 157, 172, 197, 283

See application file for complete search history.

(56) References Cited

U.S. PATENT DOCUMENTS

| | | | |
|---|---|---|---|
| 4,996,574 A * | 2/1991 | Shirasaki | H01L 29/42376 257/347 |
| 7,879,675 B2 * | 2/2011 | Radosavljevic | H01L 23/485 438/268 |

(Continued)

OTHER PUBLICATIONS

White et al., "X-ray fabrication of nonorthogonal structures using 'surface' masks", Journal of Vacuum Science & Technology B: Microelectronics and Nanometer Structures Processing, Measurement and Phenomena, 1997, pp. 2514-2516, vol. 15, American Institute of Physics.

(Continued)

*Primary Examiner* — Dao H Nguyen
(74) *Attorney, Agent, or Firm* — Trop, Pruner & Hu, P.C.

(57) ABSTRACT

An embodiment includes an apparatus comprising: a transistor including an epitaxial source, a channel, and an epitaxial drain; a fin that includes the channel, the channel including a long axis and a short axis; a source contact corresponding to the source; and a drain contact corresponding to the drain; wherein (a) an additional axis intersects each of the source contact, the source, the drain, and the drain contact, and (b) the additional axis is parallel to the long axis. Other embodiments are described herein.

23 Claims, 20 Drawing Sheets

(56) References Cited

U.S. PATENT DOCUMENTS

| | | | | |
|---|---|---|---|---|
| 7,968,394 B2* | 6/2011 | Orlowski | ......... | H01L 29/41791 |
| | | | | 438/197 |
| 9,752,251 B2* | 9/2017 | Chan | ....... | C30B 25/04 |
| 2012/0032275 A1* | 2/2012 | Haran | ....... | H01L 21/28518 |
| | | | | 257/401 |
| 2014/0220752 A1* | 8/2014 | Park | ......... | H01L 29/66795 |
| | | | | 438/283 |
| 2015/0221724 A1* | 8/2015 | Kerber | ......... | H01L 29/665 |
| | | | | 257/347 |
| 2015/0270222 A1* | 9/2015 | Alptekin | ....... | H01L 27/092 |
| | | | | 257/288 |
| 2016/0020305 A1* | 1/2016 | Obradovic | ......... | H01L 29/7391 |
| | | | | 257/39 |
| 2016/0163850 A1* | 6/2016 | Liu | ....... | H01L 29/785 |
| | | | | 257/338 |
| 2018/0090583 A1* | 3/2018 | Choi | ....... | H01L 29/401 |

OTHER PUBLICATIONS

Lapedus, "Semiconductor Engineering: 1xnm DRAM Challenges", Manufacturing & Process Technology, Feb. 18, 2016, pp. 1-11, https://semiengineering.com/author/mark-lapedus/.

Panda et al, "Tuning Curvature in Flow Lithography: A New Class of Concave/Convex Particles", Langmuir, Mar. 2, 2009, pp. 5986-5992, vol. 25, No. 10, American Chemical Society.

Wu et al., "Reduction Photolithography Using Microlens Arrays: Application in Gray Scale Photolithography", Analytical Chemistry, Jul. 15, 2002, pp. 3267-3273, vol. 74, No. 14, American Chemical Society.

Neudeck et al., "Three Dimensional Devices Fabricated by Silicon Epitaxial Lateral Overgrowth", Journal of Electronic Materials, 1990, pp. 1111-1117, vol. 19, No. 10.

Sagar et al., "Growth of GaN on porous SiC by molecular beam epitaxy", 2008, pp. 1-22.

* cited by examiner

TRANSISTORS WITH BALLISTIC OR QUASI-BALLISTIC CARRIER BEHAVIOR AND LOW RESISTANCE IN SOURCE AND DRAIN NODES

TECHNICAL FIELD

Embodiments of the invention are in the field of semiconductor devices and, in particular, non-planar transistors.

BACKGROUND

A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1A:
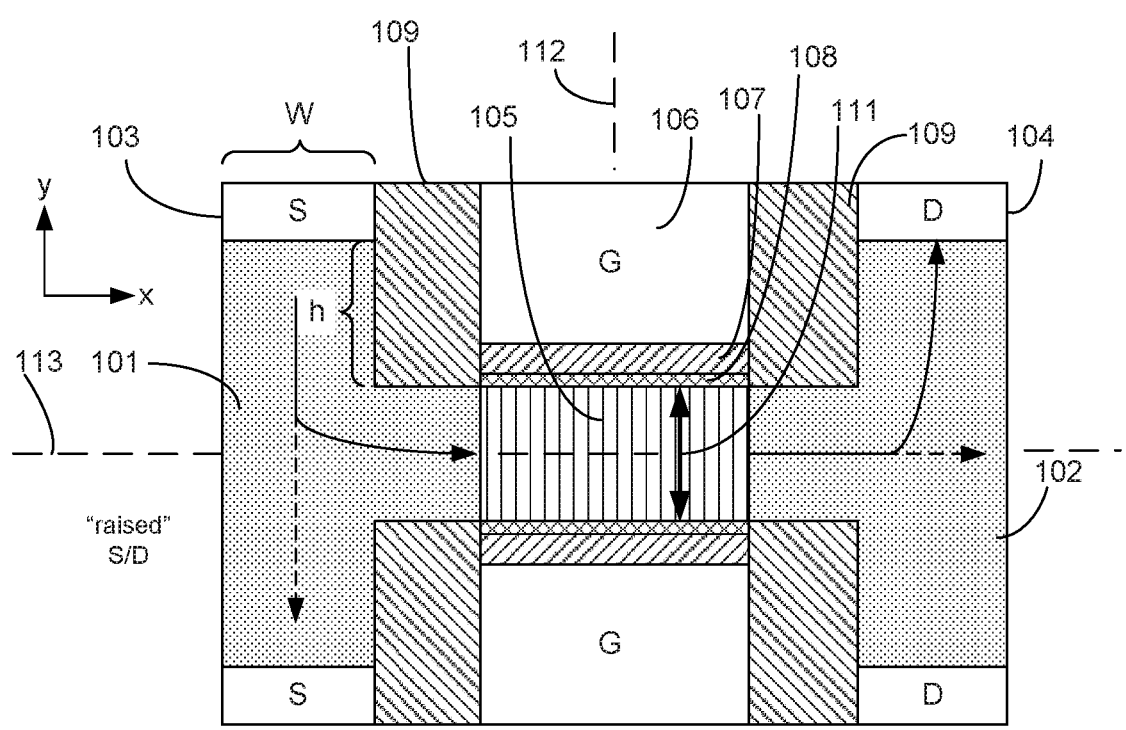
FIG. 1A includes a schematic representation of a transistor that is proportioned to exhibit ballistic carrier behavior in an embodiment.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Source/drain (S/D) resistance (RSD) is a critical parameter that affects the current drivability of transistors, such as metal-oxide-semiconductor field-effect transistors (MOSFETs), tunneling FETs (TFET), and the like. As device scaling continues (i.e., devices become smaller), RSD is becoming increasingly important because intrinsic device resistance is becoming smaller with channel length scaling, channel mobility enhancements, and current becoming more ballistic. Reducing RSD is critical factor to be managed in order to better deliver high drive currents with device scaling.

Transistor RSD has two components, one from the metal-semiconductor contact resistance and the other from the S/D semiconductor resistance. In conventional MOSFETs, the latter may be further categorized as extension resistance, tip resistance, spreading resistance, and the like. Conventional technologies to decrease RSD are based on a classical resistance model and include, for example, increasing the S/D doping density (i.e., having more carriers within the S/D), decreasing the metal-semiconductor contact resistivity ($\rho_c$), increasing the S/D contact area, and the like.

Applicant determined, however, that for extremely scaled CMOS new physical phenomena (beyond the classical resistance model) are introduced due to the presence of ballistic and quasi-ballistic carriers. As the MOSFET size (e.g. channel length and S/D regions and, more generally, the overall device length) shrinks, the carriers injected from contacts and transported through the channel may have little to no chance of scattering. In such cases, the classical picture of RSD (diffusive model) is no longer accurate, and a consideration of more fundamental physical effects (e.g., carrier momentum distribution and directionality) is required to resolve the S/D access issue. The effect is more significant (i.e., more negative impact on current drive) for novel channel materials with light effective mass (m*) (e.g., III-V n-channel as opposed to silicon n-channel MOSFET) due to the reduced scattering rate. Still, the effect is also relevant to more conventional materials such as silicon (relatively high m*) when the device length is extremely scaled.

However, embodiments presented herein address these issues of managing RSD in extremely scaled devices that exhibit ballistic carrier behavior. Such embodiments include geometrical designs and fabrication processes for S/D epitaxial (epi) regions and metal contacts to reduce RSD and increase the current drivability of extremely scaled CMOS with silicon and novel materials (e.g., group III-V and/or group IV materials).

More specifically, embodiments provide geometrical designs and fabrication process for S/D epitaxial regions and metal contacts to address the issues of ballistic and quasi-ballistic carriers (e.g., momentum distribution and directionality) for: (a) the carrier injection from the source, and (b) collection by the drain) while also increasing the S/D contact area for the given device pitch (e.g., where device pitch includes the length from the outer edge of the source region to the outer edge of the drain region). Embodiments include at least three architectures (sometimes referred to herein as "raised S/D", "angled S/D", and "edge S/D") that address the issues of ballistic and quasi-ballistic carriers and present the design parameter ranges (optimized for silicon and non-silicon materials) for these architectures.

The embodiments effectively reduce RSD and improve drive currents for scaled CMOS. The embodiments also eliminate or reduce the need for higher S/D doping. This is important because doping the S/D becomes increasingly challenging for extremely scaled devices (where the S/D are extremely small). Ultimately, the embodiments allow for more aggressively scaled devices.

FIG. 1A shows a cross-section of a FinFET in an embodiment. In this structure (sometimes referred to herein as a "raised S/D"), the doped S/D epi regions 101, 102 extend beyond the channel width 111, and the metal contacts 103, 104 land on the S/D regions along the direction (y) (direction y is parallel to channel short axis 112) and perpendicular to the channel direction (x) (direction x is parallel to channel long axis 113). Gate 106 is on gate dielectric 107 and oxide 108 (silicon dioxide). While in this figure elements 107 and 108 are distinct from one another in other embodiments they may be combined with one another. In still other embodiments there may be only one gate dielectric layer or three or more gate dielectric layers. Channel 105, if doped, is less doped than S/D regions 101, 102. Gate 106 is between nitride spacers 109. Solid arrows in FIG. 1A represent the direction of the carrier flow. While FIG. 1A shows carriers moving along the −y direction this is just for clarity of illustration and those of ordinary skill in the art will realize carriers also move along the +y direction and the like. Carriers are injected from the source contact 103, turn around (by 90°) to enter the channel 105, transport through and exit the channel, and then turn around (by 90°) and get collected by the drain 104. Therefore, a significant change of carrier momentum is required to make the current flow from source contact 103 to drain contact 104. In large scale devices with long S/D regions (i.e., the width "w" in the x direction of the S/D region is long and/or the height "h" in the y direction of the S/D region is long), a great deal of carrier scattering in the S/D is likely, which provides many carriers that make the 90° turn. For scaled devices with a short S/D region (i.e., short "w" and/or short "h"), however, scattering sufficient to provide drive current is less likely. The chance of scattering in the S/D is small and the carriers may have ballistic behavior (no scattering, no momentum change) or quasi-ballistic behavior (little scattering, little momentum change), especially for light m* material. As described by the dashed arrows in FIG. 1A, ballistic carriers emitted from the source contact may not be injected into the channel, and ballistic carriers exiting the channel may not be collected by the drain contact. Also in the classical picture of resistance (where R is proportional to the conductor length), reducing the height (h) of the raised S/D may appear beneficial in reducing RSD. In scaled CMOS, however, Applicant determined this is not the case.

Thus, while FIG. 1A is scaled aggressively and therefore exhibits ballistic/semi-ballistic carrier behavior, Applicant determined how to proportion various device parameters to balance carrier scattering (increasing h and w beyond a certain amount) while still managing resistance from the increased size of the S/D regions (ensuring h and w are not increased beyond another amount). More specifically, to effectively minimize RSD for the "raised S/D" in FIG. 1A, the height h of the raised S/D is chosen (in the order of the carrier mean-free-path (MFP), which depends on the S/D material) to facilitate the carrier momentum change and turn-around (h is not too small) while not adding too much additional semiconductor resistance (h is not too large). These proportions are discussed further below.

Figure 1B:
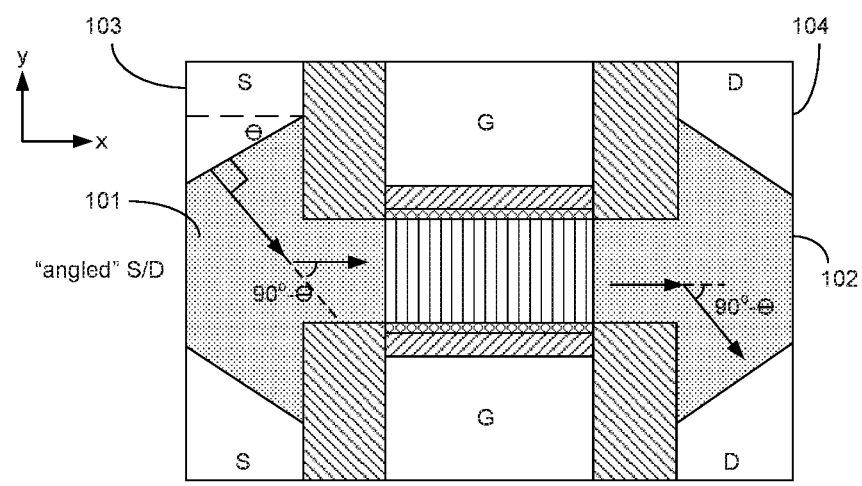
FIG. 1B includes a schematic representation of a transistor, with "angled" source/drain sidewalls, that is proportioned to exhibit ballistic carrier behavior in an embodiment.

To further resolve the RSD issue in scaled CMOS, FIG. 1B includes an "angled" S/D structure. Here the S/D epi is grown along the lateral (x) direction, and the S/D contacts face the channel with a finite angle Θ. As shown by the arrows in FIG. 1B, carriers emitted from the source contact may enter the channel after an angle change of 90°−Θ, which is smaller than in the "raised" S/D (Θ=0°, 90° angle change) in FIG. 1A. This means that a smaller amount of carrier scattering is required for the carriers to enter the channel. Similarly with the drain region, carriers exiting the channel may be collected after a smaller number of scattering events (smaller angle change of 90°−Θ) than in FIG. 1A (angle change of 90°). Overall, angling the S/D sidewalls improves the carrier injection/collection efficiency and increases the current drivability, thereby reducing the effective RSD. As will be further discussed below, this "angled" S/D approach is also beneficial to increasing the metal contact area, which also reduces RSD for a given $\rho_c$.

Figure 1C:
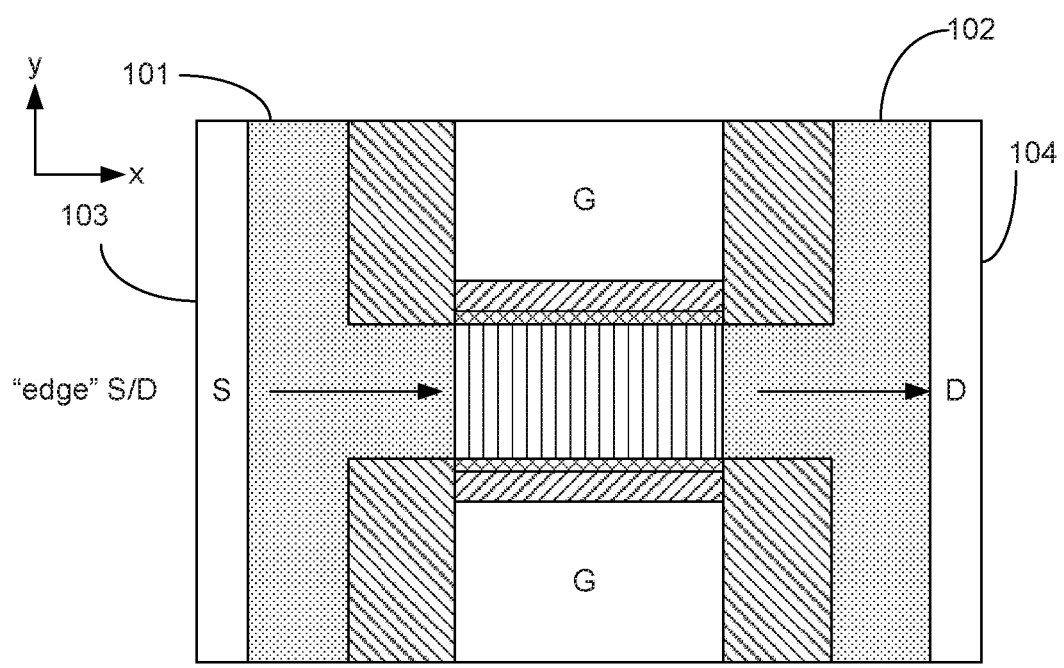
FIG. 1C includes a schematic representation of a transistor, with "edge" source/drain sidewalls, that is proportioned to exhibit ballistic carrier behavior in an embodiment.

FIG. 1C provides an "edge" S/D structure to fundamentally resolve the carrier turn-around issue (need for carrier to make 90 degree turn to enter channel and another 90 degree turn to exit via the drain contact). Here the angled contacts are such that Θ=90°, so no carrier angle change is required within the doped semiconductor. Due to the significantly high density-of-states (DOS), metal regions have low resistivity even if MFP may be short. Thus they would have large number of carriers scattered in the right direction coming in to the semiconductor. Carriers are injected and collected most efficiently due to the best carrier directionality. As will be discussed further below, this approach also increases the contact area and further reduces RSD, depending on the device pitch.

Figure 2A:
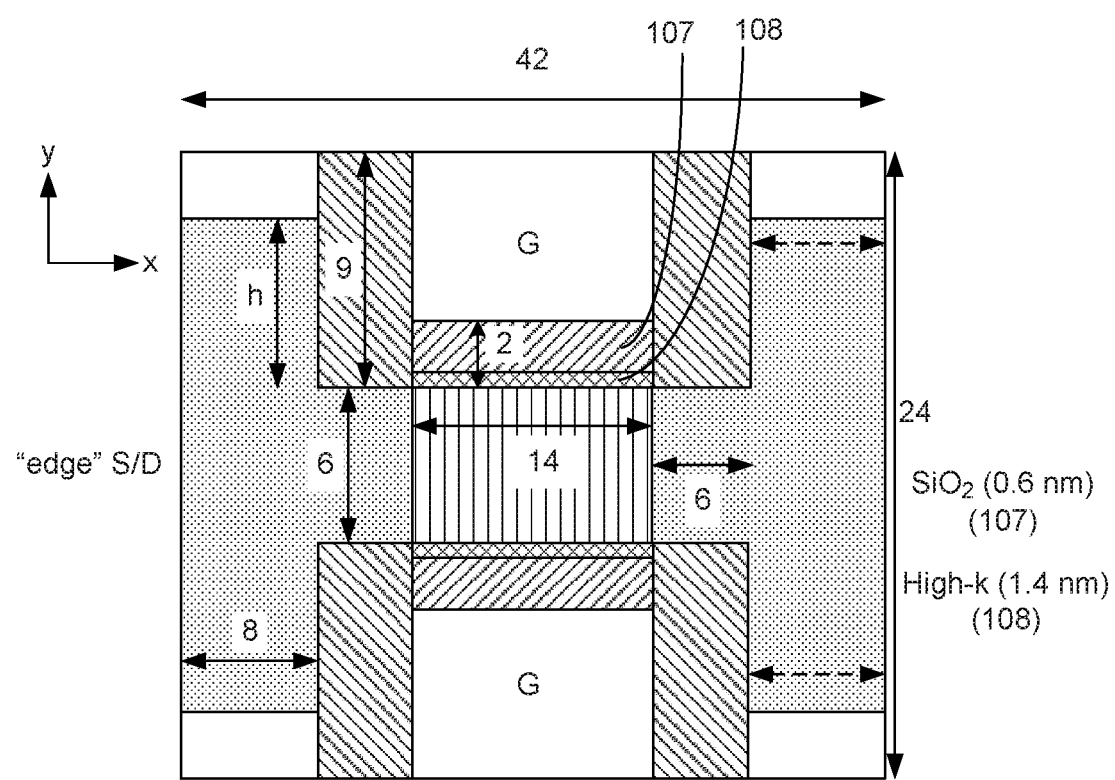
FIG. 2A includes a schematic representation of a transistor with parameters that are adjusted to vary ballistic carrier behavior in an embodiment.
Figure 2B:
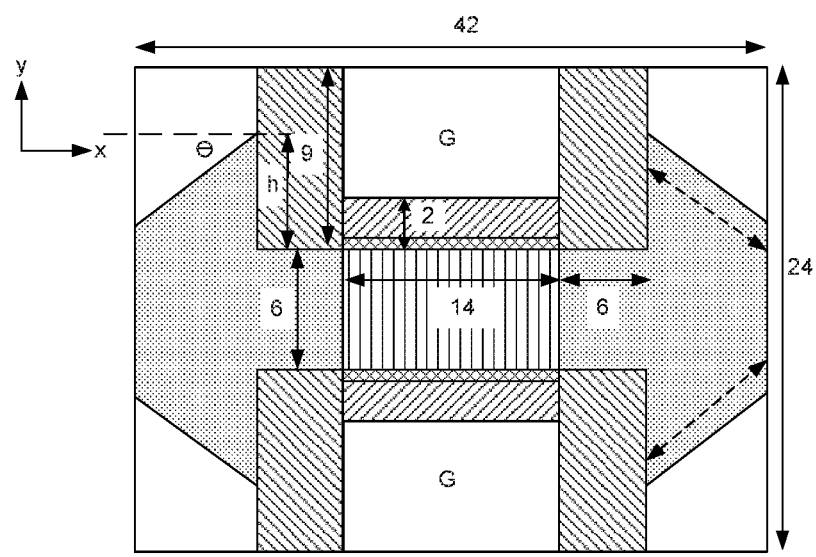
FIG. 2B includes a schematic representation of a transistor, with "angled" source/drain sidewalls, with parameters that are adjusted to vary ballistic carrier behavior in an embodiment.
Figure 2C:
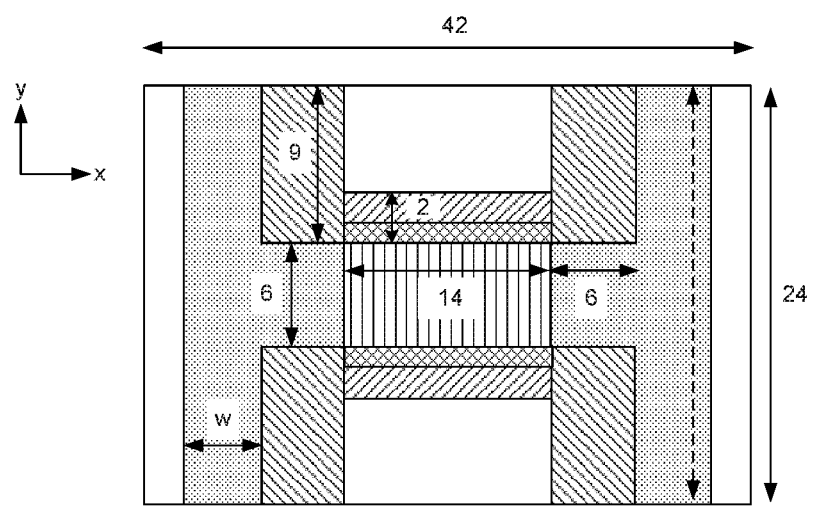
FIG. 2C includes a schematic representation of a transistor, with "edge" source/drain sidewalls, with parameters that are adjusted to vary ballistic carrier behavior in an embodiment.

In FIGS. 2A, 2B, and 2C (units are in nm), Applicant performed modeling based on reasonable projections of near-future CMOS scaling. Device parameters were varied, such as the height (h) of the "raised" S/D (FIG. 2A), the height (h) and the angle (Θ) of the "angled" S/D (FIG. 2B), and the width (w) of the "edge" S/D (FIG. 2C). Except for the S/D region, all other parameters (e.g., gate and channel regions) remain the same. The modeling was performed for silicon (for n- and p-types) and non-silicon ($In_{0.53}Ga_{0.47}As$ for n-type, Ge for p-type) materials to exemplify the material dependence of carrier performance. All modeling includes $\rho_c$=3.5e-9 Ω-cm$^2$ at the metal-semiconductor interface to represent the practical case of modern CMOS.

Applicant varied the height (h) of the raised S/D from 0 to the maximum allowed by the fin pitch (9 nm) (defined in FIG. 2). In other words, with a 6 nm wide channel and a 24 nm wide device, the "pitch" limits h to 9 nm. Next, Applicant swept the width (w) of the "edge" S/D from 0 to the maximum allowed by the gate pitch (8 nm) (defined in FIG. 2) (considering channel length of 14 nm and collective spacer length of 12 nm for a 42 nm long device).

Figure 3:
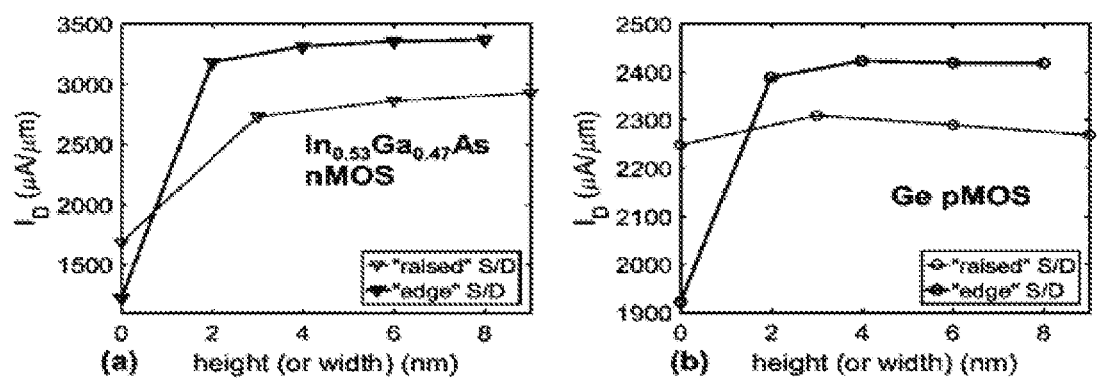
FIG. 3 addresses behavior for the embodiments of FIGS. 1A, 1C, 2A, and 2C.

FIG. 3 shows Monte-Carlo (MC) simulation results for $I_{Dsat}$ (high $V_G$, high $V_D$) of Si n- and pMOS with "raised" and "edge" S/D structures. For "raised" S/D, FIG. 3 shows that h~3 nm gives the largest current. For h=0 nm, the current is off-optimum because there is little space to facilitate the 90° carrier turn required by the raised S/D. As h increases the current decreases again because the semiconductor resistance increases in a classical way. At h~3 nm (in the order of the MFP of Si material), the current is maximized because it is large enough to facilitate the carrier turn-around through scattering while not adding too much additional semiconductor resistance.

For "edge" S/D, Applicant determined that for w=0 nm, the current is significantly suppressed because the S/D contact area is small resulting in a large RSD for the given $\rho_c$. As w increases, the current improves, and it becomes maximum at w~4 nm. For a smaller w, the contact area may be physically small (e.g., w=0 nm) or effectively small due to the limited space for the carrier spreading to occur (e.g., w=2 nm). If w is increased too much, then current decreases (RSD increases) again due to the classical semiconductor resistance. Note that the optimum w of ~4 nm is again in the order of the MFP of silicon. This w is large enough to make the carrier spreading occur (not limiting the effective contact area) while it does not add too much additional semiconductor resistance.

Another important point in FIG. 3 is that the maximum current for the "edge" S/D is significantly larger than that for the "raised" S/D. This comes from at least two factors. First, the "edge" S/D is more advantageous for the effective injection/collection of carriers in scaled devices, as discussed with regard to FIGS. 1A and 1C. Second, for the given fin/gate pitch of the model device (see FIGS. 2A and 2C), the edge S/D also gives a larger S/D contact area. (Note that the second factor may depend on the details of the device pitch.)

Thus, FIG. 3 shows simulation results of: (a) Si nMOS and (b) Si pMOS for $I_{Dsat}$ ($V_G$=$V_D$=1.2 V (−1.2 V) for nMOS (pMOS)) for the "raised" S/D with various h values and "edge" S/D with various w values. For "raised" S/D, the current is maximized when h is in the order of the Si MFP (~3 nm). For "edge" S/D, the current is maximized at w~4 nm, which is in the order of the Si MFP. The maximum current for the edge S/D is significantly larger than that of the raised S/D.

Figure 4:
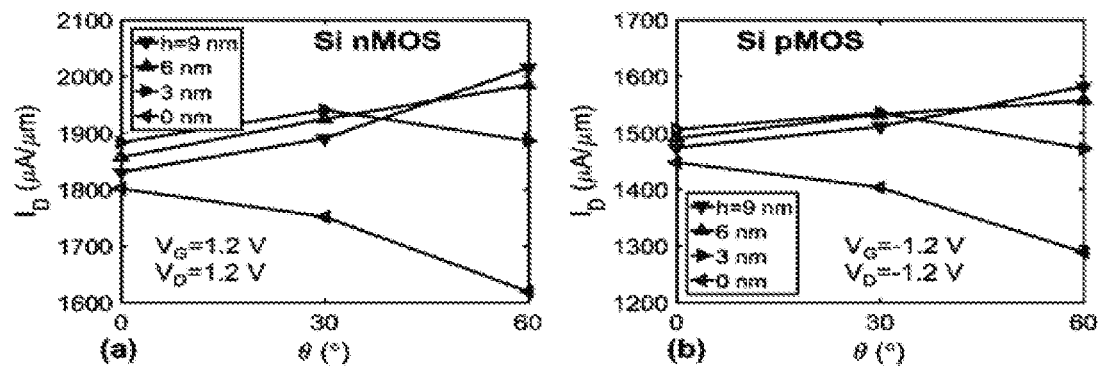
FIG. 4 addresses behavior for the embodiments of FIGS. 1A, 1C, 2A, and 2C.

FIG. 4 shows MC simulation results for $I_{Dsat}$ of "raised" and "edge" S/D structures with non-Si materials ($In_{0.53}Ga_{0.47}As$ for nMOS and Ge for pMOS). For $In_{0.53}Ga_{0.47}As$ nMOS, the current continues to increase as h (raised S/D) or w (edge S/D) increases until its maximum allowed by the device pitch. This trend is different than in Si (FIG. 3) where there existed an optimum h or w. This is because the MFP of n-type $In_{0.53}Ga_{0.47}As$ (~tens of nanometers) is much longer than that of Si (~a few nanometers). In principle, the optimum h or w for $In_{0.53}Ga_{0.47}As$ should be in the order of its MFP, but it may exceed the device size constraint domain. Therefore, the optimum occurs at the maximum h or w allowed by the device pitch. For Ge pMOS, the behavior is similar to that of Si—current becomes maximum when h~3 nm (raised S/D) or w~4 nm (edge S/D). This is because the carrier MFP of p-type Ge is similar to that of Si. For all cases, the maximum current for the "edge" S/D is larger than that for the "raised" S/D, similarly to the Si case in FIG. 3.

Thus, FIG. 4 provides MC simulation results of: (a) $In_{0.53}Ga_{0.47}As$ nMOS and (b) Ge pMOS for $I_{Dsat}$ ($V_G$=$V_D$=1.2 V (−1.2 V) for nMOS (pMOS)) for "raised" S/D with various h and "edge" S/D with various w. For $In_{0.53}Ga_{0.47}As$ nMOS, the current continues to increase as h or w increases and reaches its maximum allowed by the device pitch because the carrier MFP is very long. For Ge pMOS, the current is maximized at h~3 nm (raised S/D) and w~4 nm (edge S/D), which are in the order of the carrier MFP of p-type Ge. For all cases, the maximum current for the edge S/D is significantly larger than that of the raised S/D.

Next, Applicant addressed the "angled" S/D structure. Applicant started from the "raised" S/D)(Θ=0° for a given h and increased Θ. As Θ increases, at least two effects occur: (1) the efficiency of carrier injection/collection improves (as discussed with regard to FIGS. 1B and 1C), (2) while the metal contact area may or may not continuously increase depending on h.

Figure 5:
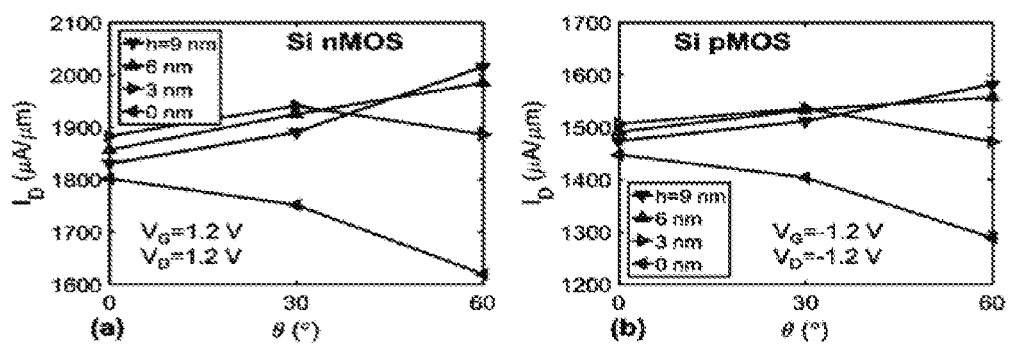
FIG. 5 addresses behavior for the embodiments of FIGS. 1B and 2B.

FIG. 5 shows MC simulation results for $I_{Dsat}$ vs. Θ of Si n- and pMOS for various h values. For a large h (e.g., h=9 or 6 nm), the current continuously increases with Θ due to at least two effects: (1) the improvement of carrier injection/collection efficiency, and (2) the continuous increase of the contact area. For a small h, however, the contact area may or may not increase while the injection/collection efficiency improves as Θ increases. So one embodiment includes an optimum Θ (e.g., h=3 nm, Θ~30°), or the current may actually decrease as Θ increases (e.g., h=0 nm).

Of note (as determined by Applicant) is that the relative importance of the carrier injection/collection efficiency and the contact area depends on the S/D material. For materials with high carrier scattering rate (large m*, large density-of-states (DOS), short MFP) such as Si, the carrier momentum and turn-around (discussed with regard to FIG. 1) is less of an issue, so the contact area becomes more important. For materials with low scattering rate (small m*, small DOS, long MFP) such as n-type III-V, the carrier turn-around issue becomes critical, making the contact area relatively less important.

Figure 6:
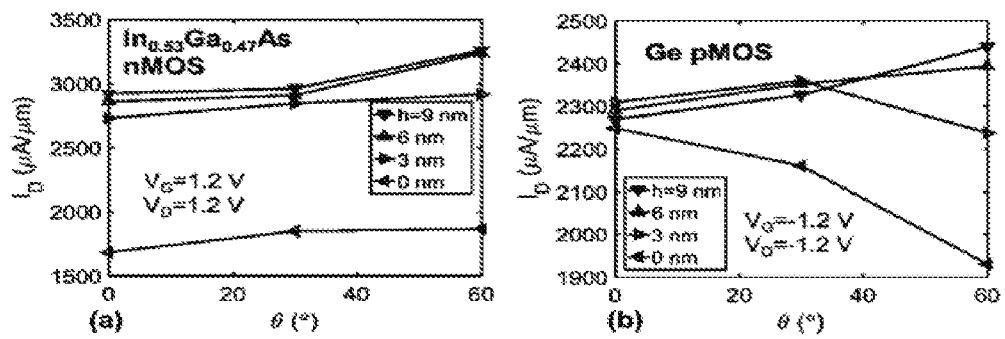
FIG. 6 addresses behavior for the embodiments of FIGS. 1B and 2B.

FIG. 6 shows MC simulation results for $I_{Dsat}$ vs. Θ of $In_{0.53}Ga_{0.47}As$ nMOS and Ge pMOS for "angled" S/D with various h values. For $In_{0.53}Ga_{0.47}As$ nMOS, $I_{Dsat}$ continues to increase with Θ for all h although the contact area may actually decrease with Θ for small h. As explained above, this is because the issue of carrier momentum and turn-around in S/D becomes more critical for n-type $In_{0.53}Ga_{0.47}As$ (low-scattering material), making the contact area relatively less important. For Ge pMOS, the trends are similar to those of Si because the carrier scattering behavior is similar as discussed with regard to FIG. 4.

Figure 7:
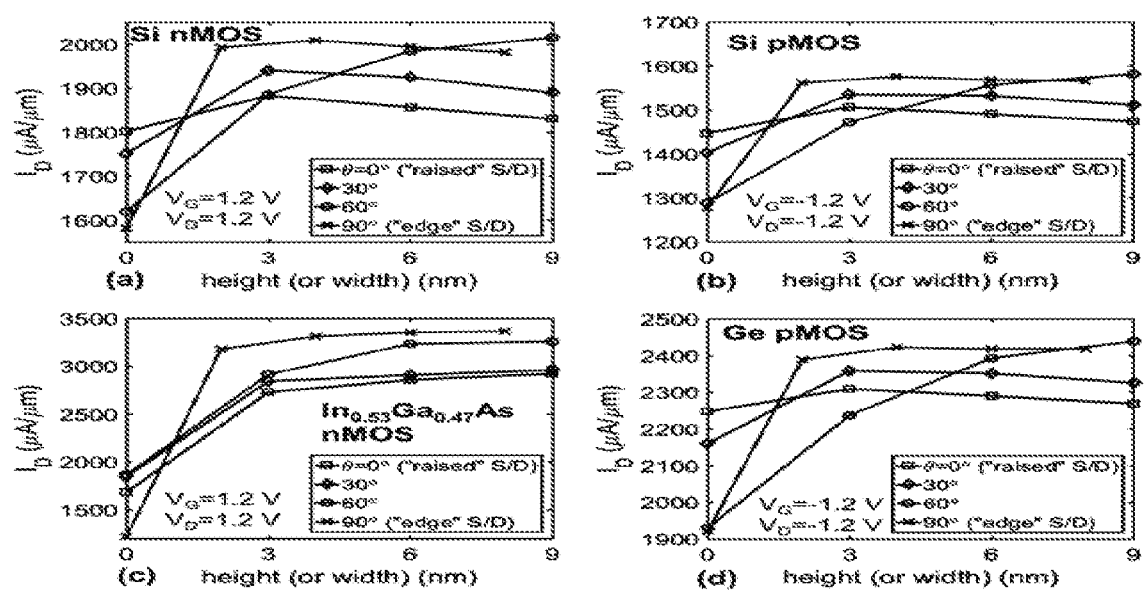
FIG. 7 addresses behavior for the embodiments of FIGS. 1A, 1B, 1C, 2A, 2B, and 2C.

Simulation results are summarized in FIG. 7. They show that the design parameters (h, w, Θ) of "raised", "angled", and "edge" S/D can be carefully chosen to maximize the current drivability (minimize the effective $R_{SD}$) for Si and non-Si CMOS.

Thus, FIG. 7 shows MC simulation results for: (a) Si nMOS, (b) Si pMOS, (c) $In_{0.53}Ga_{0.47}As$ nMOS, and (d) Ge pMOS. Drive currents significantly depend on the design parameters (h, w, Θ) of "raised", "angled", and "edge" S/D structures. For Si CMOS, the global maximum occurs for "angled" S/D with h~9 nm and Θ~60° or "edge" S/D with w~4 nm. For $In_{0.53}Ga_{0.47}As$ nMOS, it occurs for "edge" S/D with w~8 nm. For Ge pMOS, the global maximum is for "angled" S/D with h~9 nm and Θ~60°.

Figure 8:
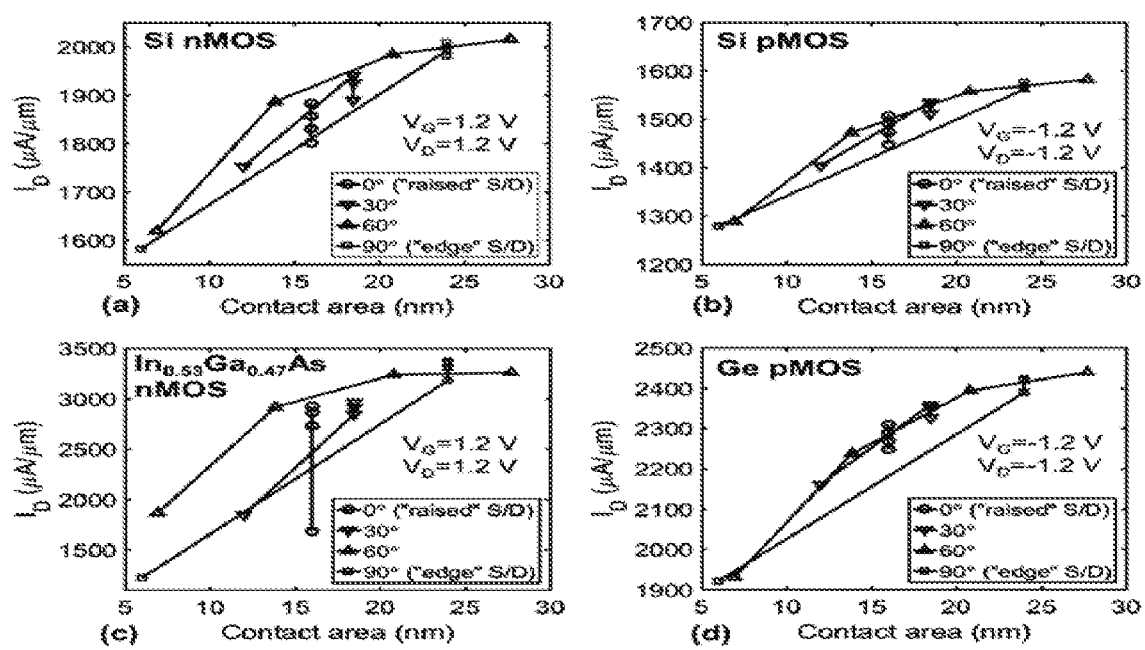
FIG. 8 addresses behavior for the embodiments of FIGS. 1A, 1B, 1C, 2A, 2B, and 2C.

The results can be understood in another perspective in FIG. 8, which plot $I_{Dsat}$ vs. contact area (represented by the dashed arrows in FIG. 2). FIG. 8 shows that for the same contact area (same effect of $\rho_c$), the drive current may change significantly depending on the S/D design. FIG. 8 shows the change is more significant in $In_{0.53}Ga_{0.47}As$ nMOS (low-scattering material) than in Si CMOS or Ge pMOS (high-scattering material).

Thus, FIG. 8 provides a summary of MC results for $I_{Dsat}$ vs. contact area (dashed arrows in FIGS. 2A, 2B, 2C). For the same contact area (same effect of $\rho_c$), drive currents may change significantly depending on the S/D design due to the carrier scattering and turn-around effect.

Figure 9:
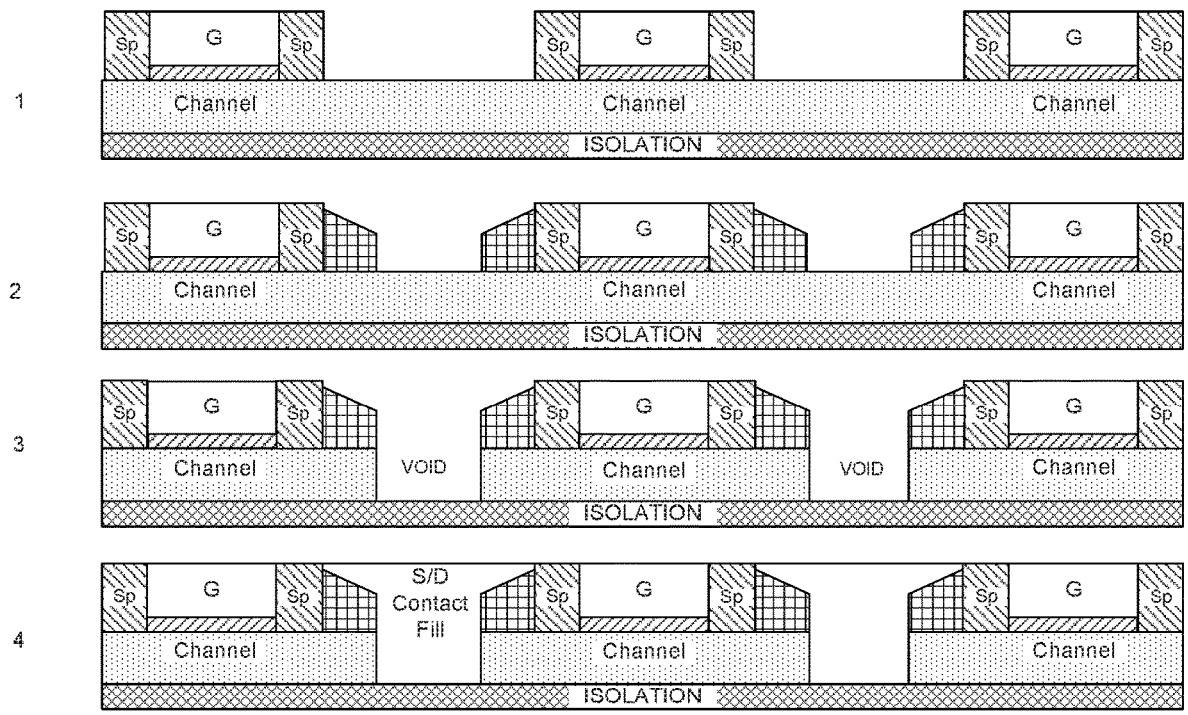
FIG. 9 includes a method for manufacturing an "edge" source/drain device in an embodiment.

To achieve one of the best cases for the contact structure (e.g., "edge" S/D)(Θ=90° with metal contacts 5~10 nm away from the channel), the process of FIG. 9 may be followed. The process flow is only an example and can be modified slightly to fit to a specific existing integration scheme. A goal is to use a spacer process to achieve both the best condition suggested above and also use the extra horizontal area under the metal spacer to further increase the current. FIG. 9 shows an example process flow to realize one of the S/D contact structures ("edge" S/D)(Θ=90° with w=5-10 nm in FIG. 2C).

In position 1 of FIG. 9 a gate stack is formed on a channel layer. The gate stack includes spacers, a gate, and a gate dielectric. In position 2 additional spacers are formed. These additional spacers may directly contact the spacers of the gate stack. In position 3 the additional spacers are used to form voids in the channel layer. For example, forming a void may include etching away a material to form the void. In position 4 the metal S/D contacts fill the voids to form "edge" embodiments.

Figure 10:
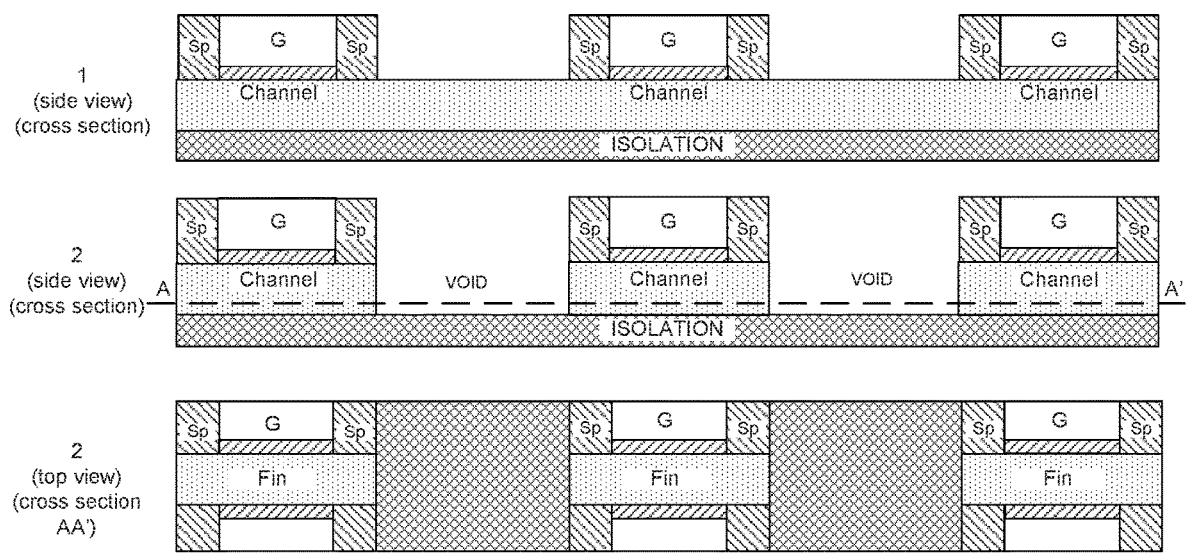
FIG. 10 includes a method for manufacturing an "angled" source/drain device in an embodiment.
Figure 10:
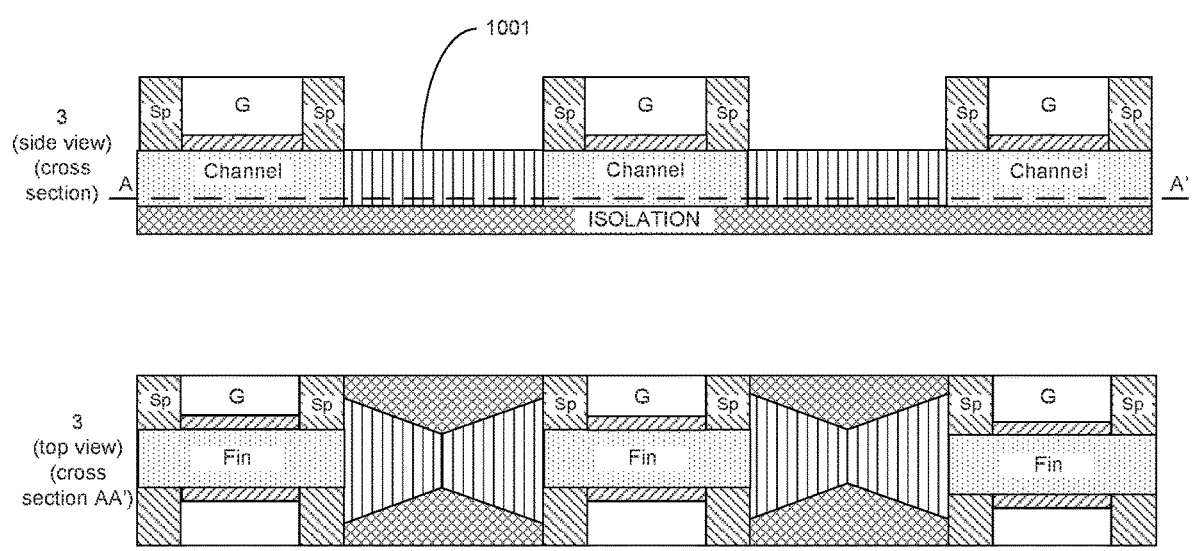
Figure 10:
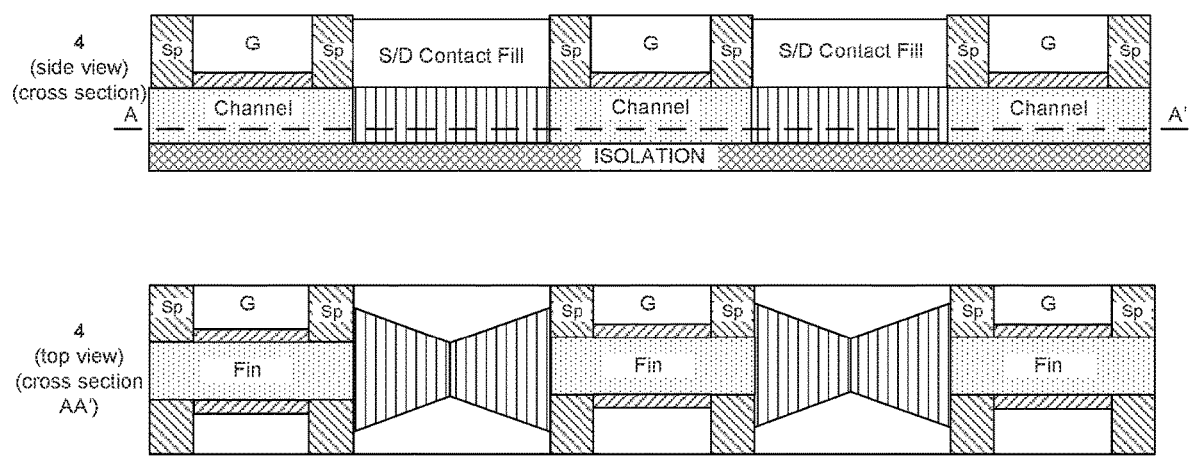

In FIG. 10, position 1 includes forming a gate stack, the gate stack including (a)(i) a layer comprising a semiconductor material, (a)(ii) a gate dielectric on the layer, (a)(iii) first and second spacers on the layer, and (a)(iv) a gate on the gate dielectric. This "side view" is a cross-section taken through the channel. Position 2 includes forming (e.g., etching) first and second voids within the layer and on opposing sides of the gate stack, a channel region being located within the layer between the first and second voids.

Position 3 includes using lateral epitaxial growth to form a source region within the first void and a drain region within the second void. This applies to the middle structure of position 3. As those of ordinary skill will appreciate, the first void may also supply a drain for another transistor, and the second void may also provide a source for an additional transistor. One example of such lateral epitaxial growth includes lateral epitaxial overgrowth (LEO) (sometimes referred to as epitaxial lateral overgrowth (ELO)) techniques known to those of ordinary skill in the art. Other techniques, in combination with or in lieu of ELO, include without limitation selective epitaxial growth (SEG), and combined lateral SEG (CLSEG). An embodiment grows lateral epi from the exposed side edge of the semiconductor fin (see cross-section top view of position 3). The crystallographic orientations and facets of the exposed side edge of the fin may be designed so that the subsequent ELO can grow S/D regions in desired shapes. The "top view" in position 3 would be taken as a cross-section AA' through the lateral epi growth.

Position 4 includes forming a source contact corresponding to the source region and a drain contact corresponding to the drain region. The "top view" in position 4 is a cross-section AA' through the channel.

Figure 11A:
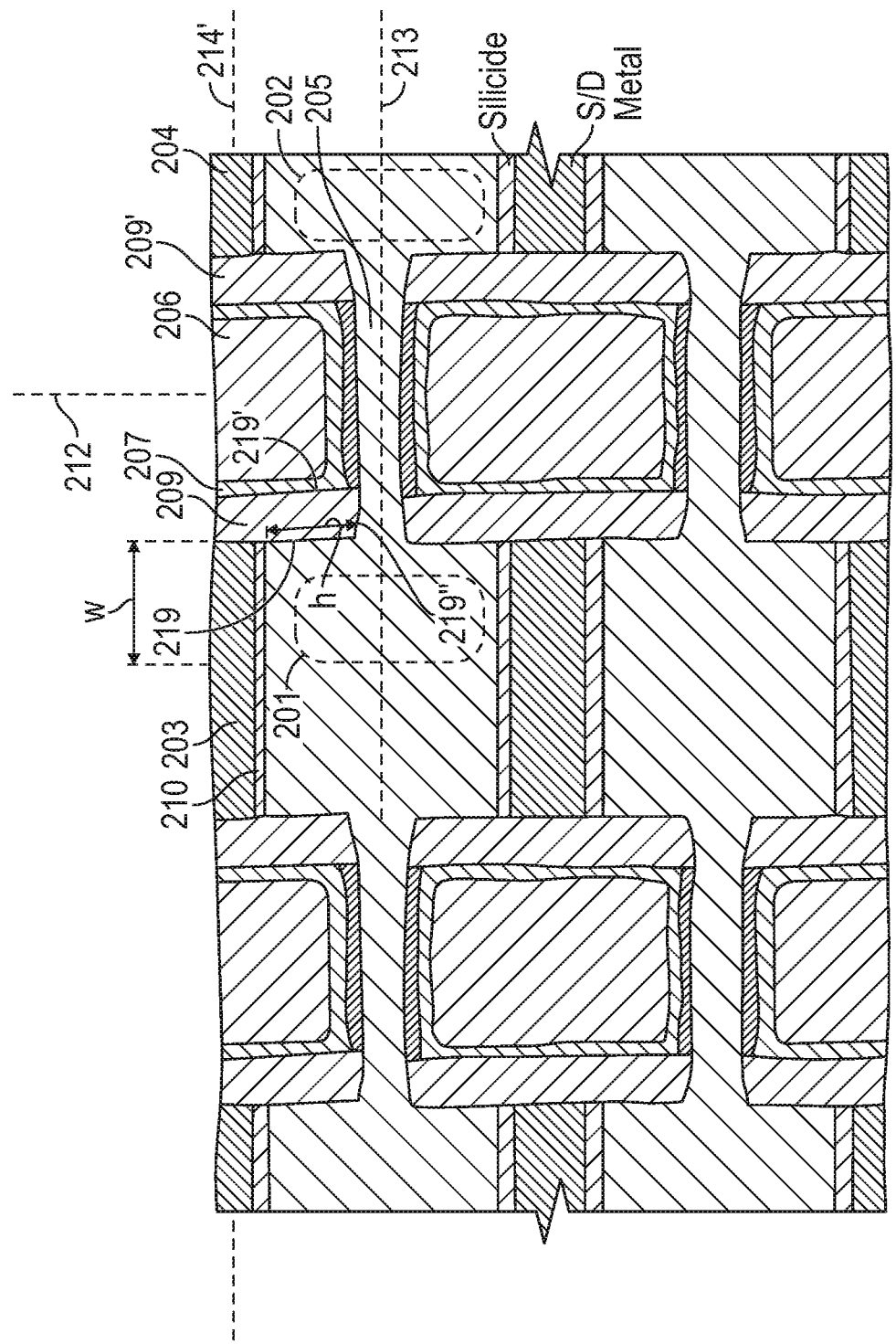
FIG. 11A includes an abstracted representation of an image of a transistor that is proportioned to exhibit ballistic carrier behavior in an embodiment.
Figure 11B:
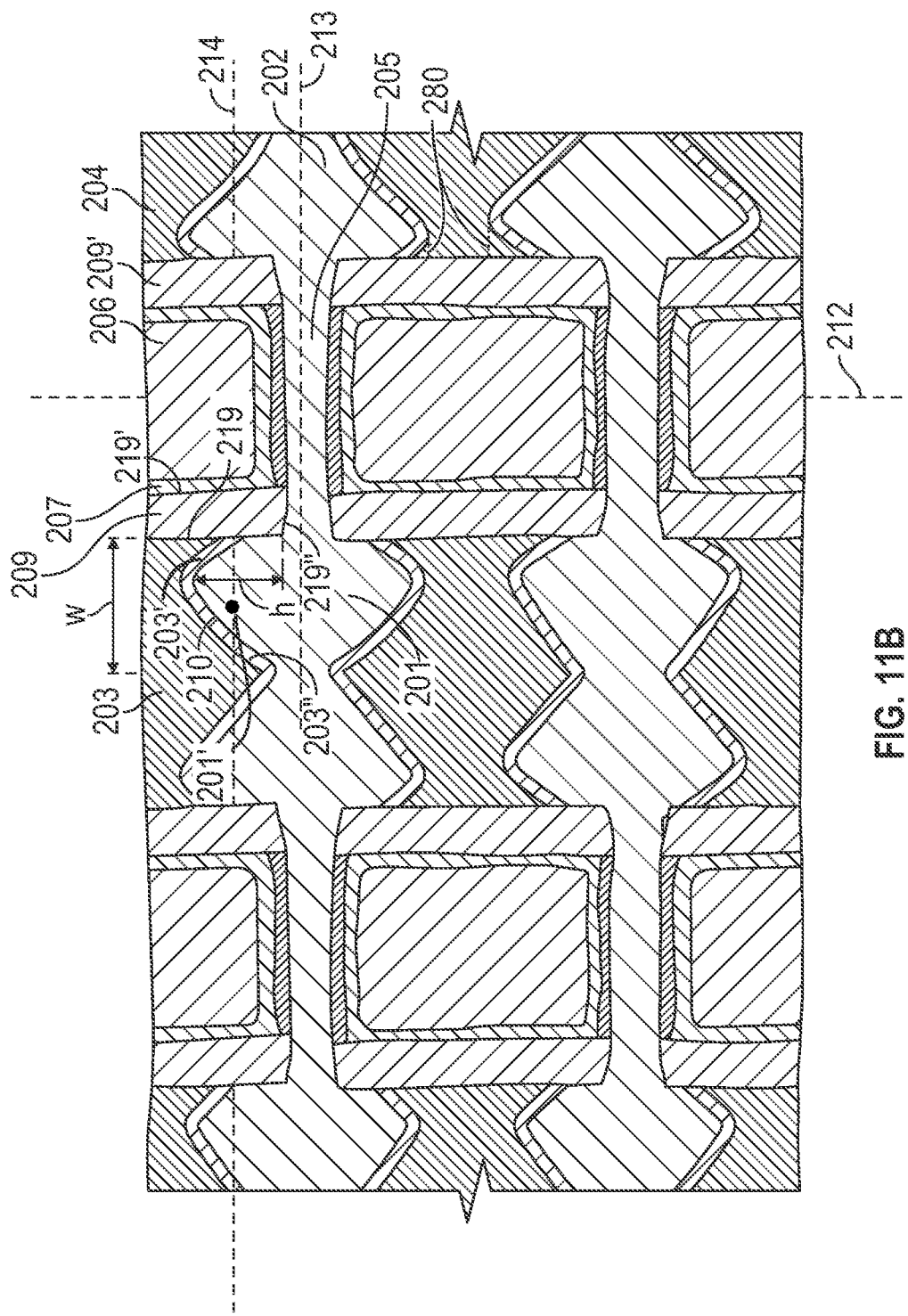
FIG. 11B includes an abstracted representation of an image of a transistor, with angled source/drain sidewalls, that is proportioned to exhibit ballistic carrier behavior in an embodiment.
Figure 11C:
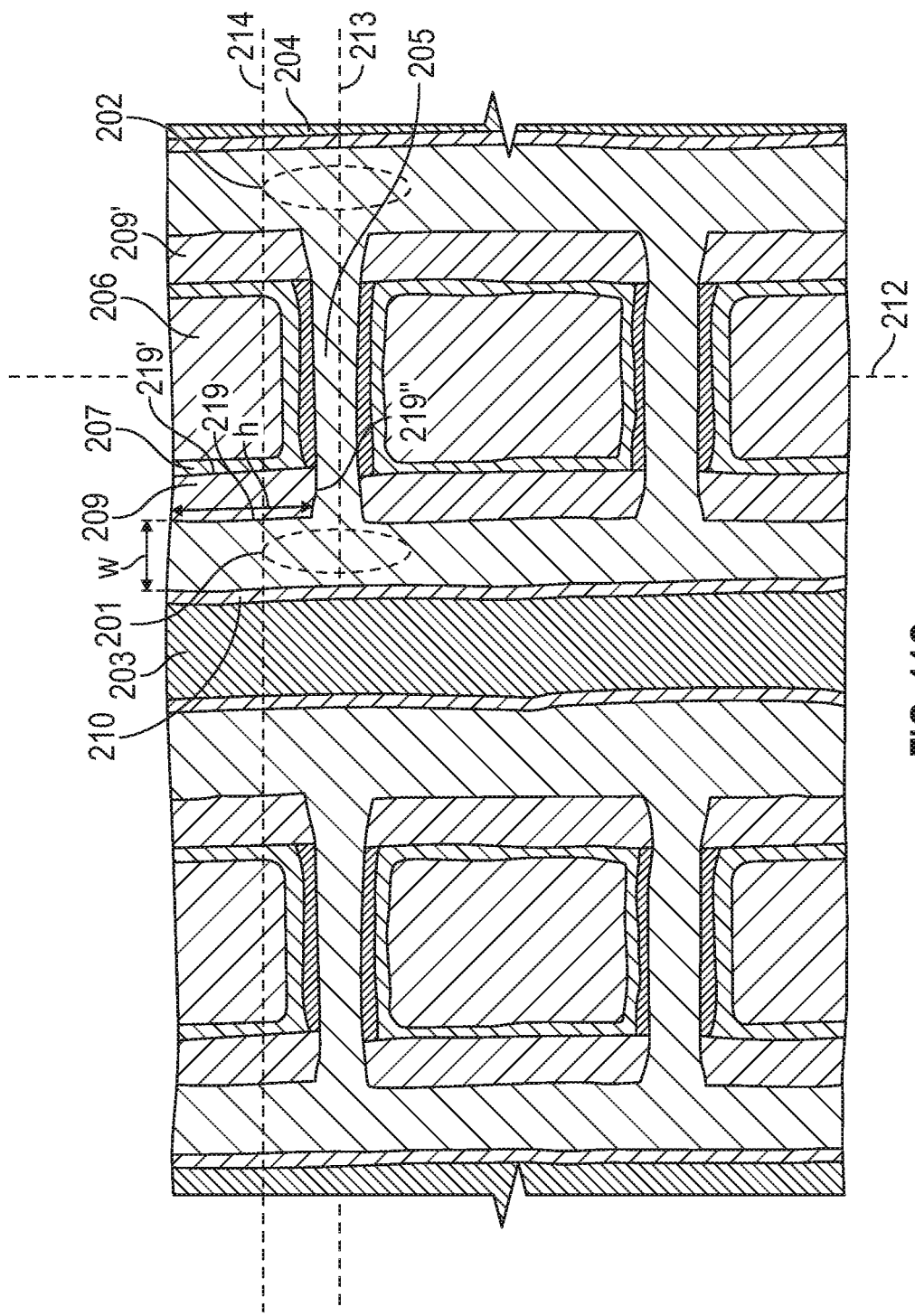
FIG. 11C includes an abstracted representation of an image of a transistor, with edge source/drain sidewalls, that is proportioned to exhibit ballistic carrier behavior in an embodiment.

FIG. 11A includes an abstracted representation of an image of a transistor that is proportioned to exhibit ballistic carrier behavior in an embodiment. FIG. 11B includes an abstracted representation of an image of a transistor, with angled source/drain sidewalls, that is proportioned to exhibit ballistic carrier behavior in an embodiment. FIG. 11C includes an abstracted representation of an image of a transistor, with edge source/drain sidewalls, that is proportioned to exhibit ballistic carrier behavior in an embodiment.

For instance, FIGS. 11A, 11B, and 11C include a transistor including an epitaxial source 201, a channel 205, and an epitaxial drain 202. Other embodiments may not require that the source or drain is epitaxial. The channel is included within a fin. The channel includes a long axis 213 and a short axis 212. A source contact 203 corresponds to the source and a drain contact 204 corresponds to the drain.

In FIGS. 11B and 11C, an additional axis 214 intersects each of the source contact 203, the source 201, the drain 202, and the drain contact 204. The additional axis 214 is parallel to the long axis 213. Gate 206, corresponding to the channel 205, is intersect by the additional axis 214. A first spacer 209 on a first side of the gate and a second spacer 209' on a second side each are intersected by the additional axis 214. A silicide 210 between the source contact and the source intersects the additional axis 214. A gate dielectric 207 between the channel and the gate intersects the additional axis 214.

In FIGS. 11A, 11B, and 11C, the first spacer includes first 219 and second 219' sidewalls. The first sidewall is between the second sidewall and the source. In an embodiment, the source includes at least one of silicon and a group IV element (e.g., Ge). The source extends a first length w, measured parallel to the long axis and from the first sidewall of the first source, no more than 12 nm. However, in other embodiments w is no more than 4, 6, 8, 10, 14, or 16 nm. The spacer includes a third sidewall 219" that couples the first sidewall 219 to the second sidewall 219'. The source extends h, measured parallel to the short axis, at least 2 nm and no more than 6 nm from the third sidewall. However in other embodiments h is at least 1, 3, 4, 5 nm or more. In other embodiments h is no more than 4, 6, 8, 10, 14, or 16 nm.

In another embodiment, in FIGS. 11A, 11B, and 11C the source includes a group III material and a group V material (e.g., InGaAs); and the source extends a first length w no more than 35 nm. However, in other embodiments w is no more than 4, 5, 6, 7, 9, 10, 15, 20, 25, 30, 40, or 45 nm. The source extends h at least 2 nm and no more than 8 nm from the third sidewall. However in other embodiments h is at least 1, 3, 4, 5 nm or more. In other embodiments h is no more than 4, 5, 6, 7, 9, 10, 15, 20, 25, 30, 40, or 45 nm.

In FIG. 11C, the long axis 213 intersects the source contact, the channel, and the drain contact. Silicide 210 intersects the long axis.

In FIG. 11B, the source contact includes a first sidewall 203' and a second sidewall 203". The additional axis 214 intersects the first and second sidewalls. The additional axis 214 also intersects the source at a location 201', which is between the first and second sidewalls.

In embodiment, the structure of FIG. 11B is modified such that sidewall 203' is formed more orthogonal (e.g., between 85 and 95 degrees) with wall 219. For example, the sidewalls of contacts and S/D nodes may follow the profile of dashed line 280 (instead of "pinching" or tapering inwards towards the channel). Lines 280 are only drawn once in FIG. 11B but the lack of tapering (represented by lines 280) may occur for all S/D contact sidewalls in FIG. 11B in an embodiment.

In FIG. 11A, a transistor includes an epitaxial source, a channel, and an epitaxial drain; a fin that includes the channel, the channel including a long axis and a short axis; a source contact corresponding to the source; a drain contact corresponding to the drain; a gate corresponding to the channel; a gate dielectric on the gate; and a first spacer on a first side of the gate and a second spacer on a second side of the gate. An additional axis 214' intersects each of the source contact, the drain contact, the first and second spacers, the gate dielectric, and the gate, and the additional axis is parallel to the long axis. In an embodiment the source extends a first length w no more than 12 nm. However, in other embodiments w is no more than 4, 6, 8, 10, 14, or 16 nm. In an embodiment the source extends h at least 2 nm and no more than 6 nm from the third sidewall. However in other embodiments h is at least 1, 3, 4, 5 nm or more. In other embodiments h is no more than 4, 5, 7, 8, or 9 nm.

In FIG. 11A, in an embodiment the source includes a group III material and a group V material; and the source extends a first length w of no more than 35 nm. However, in other embodiment w is no more than 4, 5, 6, 7, 9, 10, 15, 20, 25, 30, 40, or 45 nm. In an embodiment the source extends h, which is at least 2 nm and no more than 8 nm from the third sidewall. However in other embodiments h is at least 1, 3, 4, 5 nm or more. In other embodiments h is no more than 4, 5, 6, 7, 9, 10, 15, 20, 25, 30, 40, or 45 nm.

Figure 12:
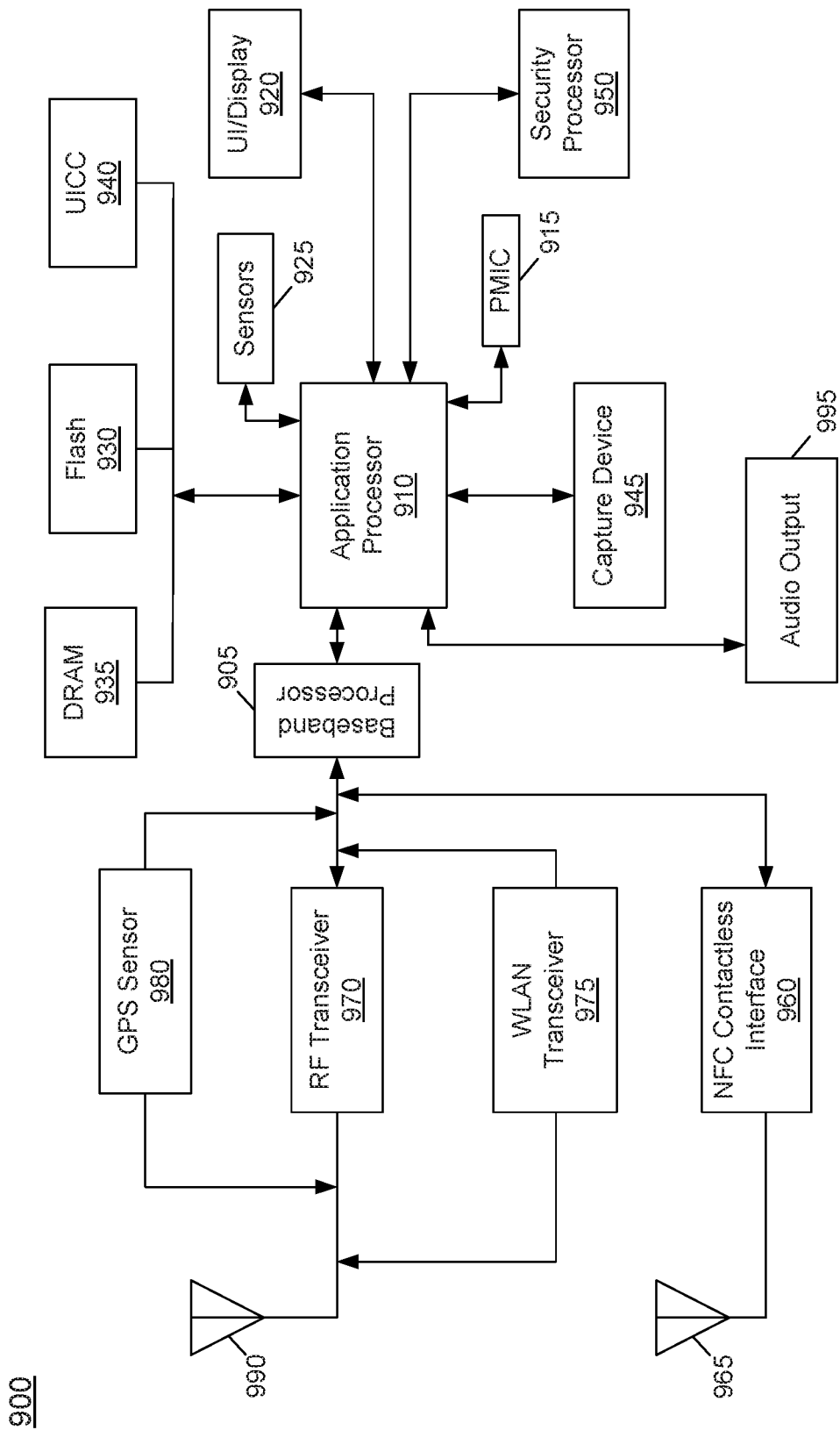
FIGS. 12, 13, 14 include systems that include embodiments.

Referring now to FIG. 12, shown is a block diagram of an example system with which embodiments can be used. As seen, system 900 may be a smartphone or other wireless communicator or any other Internet of Things (IoT) device. A baseband processor 905 (which may include transistors described herein) is configured to perform various signal processing with regard to communication signals to be transmitted from or received by the system. In turn, baseband processor 905 is coupled to an application processor 910, which may be a main CPU (which may include transistors described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display) (which may include transistors described herein). In addition, application processor 910 may couple to a memory system including a non-volatile memory (which may include transistors described herein), namely a flash memory 930 and a system memory, namely a DRAM 935. As further seen, application processor 910 also couples to a capture device 945 such as one or more image capture devices that can record video and/or still images.

A universal integrated circuit card (UICC) 940 (which may include transistors described herein) comprises a subscriber identity module, which in some embodiments includes a secure storage to store secure user information. System 900 may further include a security processor 950 (e.g., Trusted Platform Module (TPM)) (which may include transistors described herein) that may couple to application processor 910. A plurality of sensors 925 (which may include transistors described herein), including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include transistors described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 (which may include transistors described herein) and a wireless local area network (WLAN) transceiver 975 (which may include transistors described herein) may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 (which may include transistors described herein) may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 13:
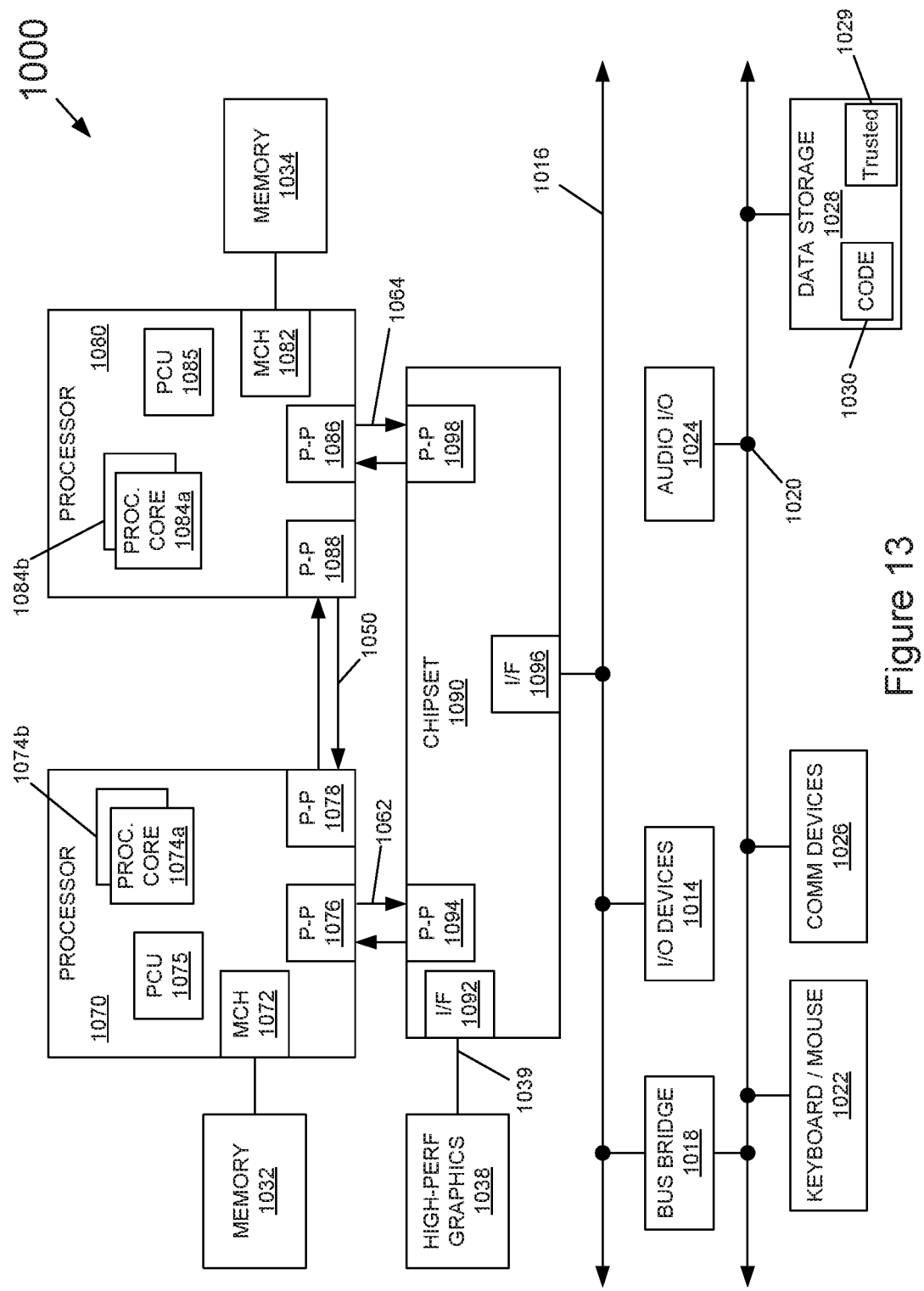

Referring now to FIG. 13, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include transistors described herein) such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 (which may include transistors described herein) via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include transistors described herein) such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 14:
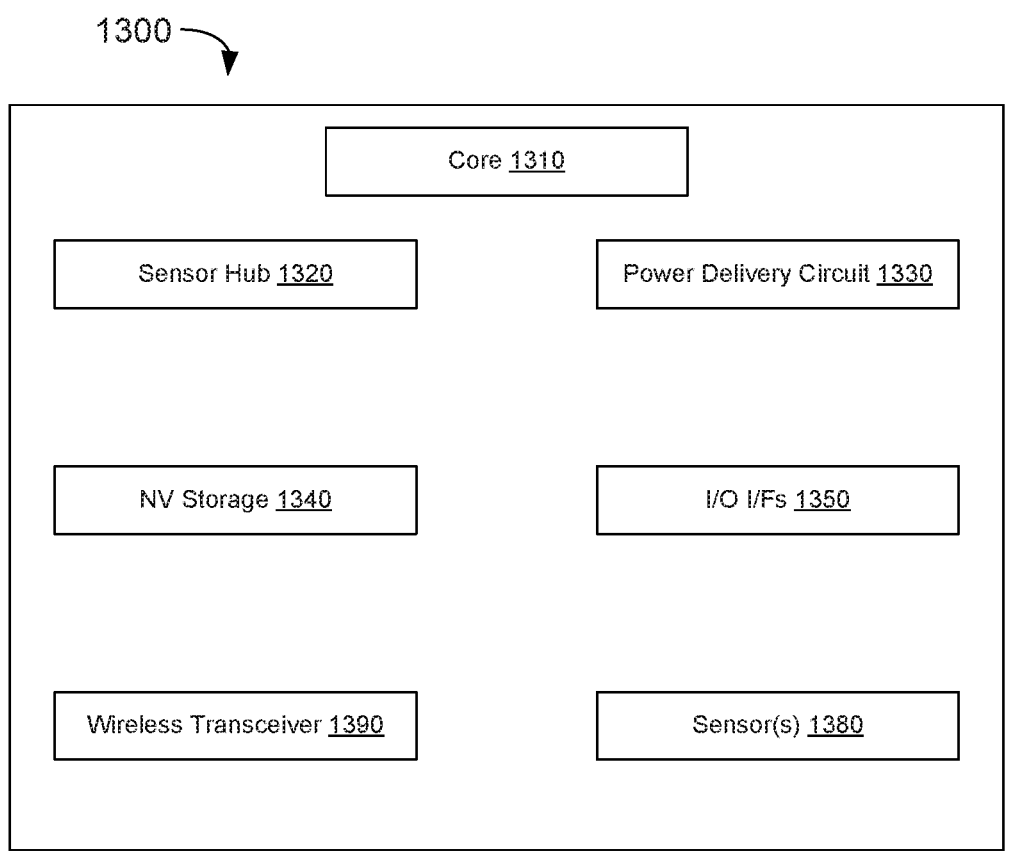

Embodiments may be used in environments where IoT devices may include wearable devices or other small form factor IoT devices. Referring now to FIG. 14, shown is a block diagram of a wearable module 1300 in accordance with another embodiment. In one particular implementation, module 1300 (which may include transistors described herein) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320 (which may include transistors described herein), which may be configured to interact with a plurality of sensors 1380, such as one or more biometric, motion environmental or other sensors. A power delivery circuit 1330 (which may include transistors described herein) is present, along with a non-volatile storage 1340 (which may include transistors described herein). In an embodiment, this circuit may include a rechargeable battery and a recharging circuit, which may in one embodiment receive charging power wirelessly. One or more input/output (TO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1

An apparatus comprising: a transistor including an epitaxial source, a channel, and an epitaxial drain; a fin that includes the channel, the channel including a long axis and a short axis; a source contact corresponding to the source; and a drain contact corresponding to the drain; wherein (a) an additional axis intersects each of the source contact, the source, the drain, and the drain contact, and (b) the additional axis is parallel to the long axis.

Another version of Example 1 includes an integrated circuit device comprising: a transistor including a source, a channel, and a drain; a fin that includes the channel, the channel including a long axis and a short axis; a source contact corresponding to the source; and a drain contact corresponding to the drain; wherein (a) an additional axis intersects each of the source contact, the source, the drain, and the drain contact, and (b) the additional axis is parallel to the long axis.

Thus, not all embodiments require epitaxial S/D.

Another version of Example 1 includes an integrated circuit device comprising: a transistor including a source, a channel, and a drain, the channel including a long axis and a short axis; a source contact corresponding to the source; and a drain contact corresponding to the drain; wherein (a) an additional axis intersects each of the source contact, the source, the drain, and the drain contact, and (b) the additional axis is parallel to the long axis.

Thus, not all embodiments are restricted to FinFETs.

Example 2

The apparatus of example 1 comprising a gate corresponding to the channel, wherein the additional axis intersects the gate.

Example 3

The apparatus of example 2 comprising a first spacer on a first side of the gate and a second spacer on a second side of the gate, the additional axis intersecting the first and second spacers.

Example 4

The apparatus of example 3 comprising a silicide between the source contact and the source, the additional axis intersecting the silicide.

Example 5

The apparatus of example 3 comprising a gate dielectric between the channel and the gate, wherein the additional axis intersects the gate dielectric.

Example 6

The apparatus of example 3 wherein: the first spacer includes first and second sidewalls; the first sidewall is between the second sidewall and the source; the source includes at least one of silicon and a group IV element; and the source extends a first length, measured parallel to the long axis and from the first sidewall of the first source, no more than 12 nm.

Example 7

The apparatus of example 6 wherein: the spacer includes a third sidewall that couples the first sidewall to the second sidewall; the source extends, measured parallel to the short axis, at least 2 nm and no more than 6 nm from the third sidewall.

Example 8

The apparatus of example 3 wherein: the first spacer includes first and second sidewalls; the first sidewall is between the second sidewall and the source; the source includes a group III material and a group V material; and the source extends a first length, measured parallel to the long axis and from the first sidewall of the first source, no more than 35 nm.

Example 9

The apparatus of example 8 wherein: the spacer includes a third sidewall that couples the first sidewall to the second sidewall; the source extends, measured parallel to the short axis, at least 2 nm and no more than 35 nm from the third sidewall.

In other embodiments the source extends, measured parallel to the short axis, at least 2 nm and no more than 5, 10, 15, 20, 25, 30, 40, 45, or 50 nm rom the third sidewall Example 10

The apparatus of example 3, wherein the long axis intersects the source contact, the channel, and the drain contact.

Example 11

The apparatus of example 1, wherein the long axis intersects the source contact, the channel, and the drain contact.

Example 12

The apparatus of example 11 comprising a silicide between the source contact and the source, the long axis intersecting the silicide.

Example 13

The apparatus of example 2, wherein: the source contact includes a first sidewall and a second sidewall; the additional axis intersects the first and second sidewalls.

Example 14

The apparatus of example 13 wherein: the additional axis intersects the source at a location; the location is between the first and second sidewalls.

Example 15

The apparatus of example 2 wherein the source includes a group III material and a group V material.

Example 16

The apparatus of example 2 wherein the source includes a group IV material.

Example 17

An apparatus comprising: a transistor including an epitaxial source, a channel, and an epitaxial drain; a fin that includes the channel, the channel including a long axis and a short axis; a source contact corresponding to the source; a drain contact corresponding to the drain; a gate corresponding to the channel; a gate dielectric on the gate; and a first spacer on a first side of the gate and a second spacer on a second side of the gate; wherein (a) an additional axis intersects each of the source contact, the drain contact, the first and second spacers, the gate dielectric, and the gate, and (b) the additional axis is parallel to the long axis.

Example 18

The apparatus of example 17 wherein: the first spacer includes first and second sidewalls; the first sidewall is between the second sidewall and the source; the source includes at least one of silicon and a group IV material; and the source extends a first length, measured parallel to the long axis and from the first sidewall of the first source, no more than 12 nm.

Example 19

The apparatus of example 18 wherein: the spacer includes a third sidewall that couples the first sidewall to the second sidewall; the source extends, measured parallel to the short axis, at least 2 nm and no more than 6 nm from the third sidewall.

Example 20

The apparatus of example 18 wherein: the first spacer includes first and second sidewalls; the first sidewall is between the second sidewall and the source; the source includes a group III material and a group V material; and the source extends a first length, measured parallel to the long axis and from the first sidewall of the first source, no more than 35 nm.

Example 21

The apparatus of example 20 wherein: the spacer includes a third sidewall that couples the first sidewall to the second sidewall; the source extends, measured parallel to the short axis, at least 2 nm and no more than 35 nm from the third sidewall.

In other embodiments the source extends, measured parallel to the short axis, at least 2 nm and no more than 5, 10, 15, 20, 40, 45, or 50 nm from the third sidewall.

Example 22

A system comprising: a memory; and a processor coupled to the memory, wherein at least one of the processor and the memory include a transistor according to example 1.

Example 23

A method comprising: forming a gate stack, the gate stack including (a)(i) a layer comprising a semiconductor material, (a)(ii) a gate dielectric on the layer, (a)(iii) first and second spacers on the layer, and (a)(iv) a gate on the gate dielectric; forming first and second voids within the layer and on opposing sides of the gate stack, a channel region being located within the layer between the first and second voids; using lateral epitaxial growth to form a source region within the first void and a drain region within the second void; forming a source contact corresponding to the source region and a drain contact corresponding to the drain region; wherein (b)(i) the layer is included in a fin, (b)(ii) the channel includes a long axis and a short axis; (b)(iii) an additional axis intersects each of the source contact, the source, the drain, and the drain contact, and (b)(iv) the additional axis is parallel to the long axis.

Another version of Example 23 includes a method comprising: forming a gate stack, the gate stack including (a)(i) a layer comprising a semiconductor material, (a)(ii) a gate dielectric on the layer, (a)(iii) first and second spacers on the layer, and (a)(iv) a gate on the gate dielectric; etching first and second voids within the layer and on opposing sides of the gate stack, a channel region being located within the layer between the first and second voids; using lateral epitaxial growth to form a source region within the first void and a drain region within the second void; forming a source contact corresponding to the source region and a drain contact corresponding to the drain region; wherein (b)(i) the layer is included in a fin, (b)(ii) the channel includes a long axis and a short axis; (b)(iii) an additional axis intersects each of the source contact, the source, the drain, and the drain contact, and (b)(iv) the additional axis is parallel to the long axis.

Example 24

The method of example 23 wherein the long axis intersects the source contact, the channel, and the drain contact.

Example 1A

An integrated circuit device comprising: a transistor including an epitaxial source, a channel, and an epitaxial drain; a fin that includes the channel, the channel including a long axis and a short axis; a source contact corresponding to the source; and a drain contact corresponding to the drain; wherein (a) an additional axis intersects the source contact, the source, the drain, and the drain contact, and (b) the additional axis is parallel to the long axis.

Example 2A

The integrated circuit device of example 1A comprising a gate corresponding to the channel, wherein the additional axis intersects the gate.

Example 3A

The integrated circuit device of example 2A comprising a first spacer on a first side of the gate and a second spacer on a second side of the gate, the additional axis intersecting the first and second spacers.

Example 4A

The integrated circuit device of example 3A comprising a silicide between the source contact and the source, the additional axis intersecting the silicide.

Example 5A

The integrated circuit device of example 3A comprising a gate dielectric between the channel and the gate, wherein the additional axis intersects the gate dielectric.

Example 6A

The integrated circuit device of example 3A wherein: the first spacer includes first and second sidewalls; the first sidewall is between the second sidewall and the source; the source includes at least one of silicon and a group IV element; and the source extends a length, the length: (a) measured parallel to the long axis and from the first sidewall of the source, and (b) being no more than 12 nm.

Example 7A

The integrated circuit device of example 6A wherein: the spacer includes a third sidewall that couples the first sidewall to the second sidewall; the source extends a distance along the first sidewall, the distance: (a) measured parallel to the short axis, and (b) being at least 2 nm and no more than 6 nm from the third sidewall.

Example 8A

The integrated circuit device of example 3A wherein: the first spacer includes first and second sidewalls; the first sidewall is between the second sidewall and the source; the source includes a group III material and a group V material; and the source extends a length, the length: (a) measured parallel to the long axis and from the first sidewall of the source, and (b) being no more than 35 nm.

Example 9A

The integrated circuit device of example 8A wherein: the spacer includes a third sidewall that couples the first sidewall to the second sidewall; the source extends a distance along the first sidewall, the distance: (a) measured parallel to the short axis, and (b) being at least 2 nm and no more than 35 nm from the third sidewall.

Example 10A

The integrated circuit device of example 3A, wherein the long axis intersects the source contact, the channel, and the drain contact.

Example 11A

The integrated circuit device of example 1A, wherein the long axis intersects the source contact, the channel, and the drain contact.

Example 12A

The integrated circuit device of example 11A comprising a silicide between the source contact and the source, the long axis intersecting the silicide.

Example 13A

The integrated circuit device of example 2A, wherein: the source contact includes a first sidewall and a second sidewall; the additional axis intersects the first and second sidewalls.

Example 14A

The integrated circuit device of example 13A wherein: the additional axis intersects the source at a location; the location is between the first and second sidewalls.

Example 15A

The integrated circuit device of example 2A wherein the source includes a group III material and a group V material.

Example 16A

The integrated circuit device of example 2A wherein the source includes a group IV material.

Example 17A

An apparatus comprising: a transistor including an epitaxial source, a channel, and an epitaxial drain; a fin that includes the channel, the channel including a long axis and a short axis; a source contact corresponding to the source; a drain contact corresponding to the drain; a gate corresponding to the channel; a gate dielectric on the gate; and a first spacer on a first side of the gate and a second spacer on a second side of the gate; wherein (a) an additional axis intersects the source contact, the drain contact, the first and second spacers, the gate dielectric, and the gate, and (b) the additional axis is parallel to the long axis.

Example 18A

The apparatus of example 17A wherein: the first spacer includes first and second sidewalls; the first sidewall is between the second sidewall and the source; the source includes at least one of silicon and a group IV material; and the source extends a length, the length: (a) measured parallel to the long axis and from the first sidewall of the source, and (b) being no more than 12 nm.

Example 19A

The apparatus of example 18A wherein: the spacer includes a third sidewall that couples the first sidewall to the second sidewall; the source extends a distance along the first sidewall, the distance: (a) measured parallel to the short axis, and (b) being at least 2 nm and no more than 6 nm from the third sidewall.

Example 20A

The apparatus of example 18A wherein: the first spacer includes first and second sidewalls; the first sidewall is between the second sidewall and the source; the source includes a group III material and a group V material; and the source extends a length, the length: (a) measured parallel to the long axis and from the first sidewall of the source, and (b) being no more than 35 nm.

Example 21A

The apparatus of example 20A wherein: the spacer includes a third sidewall that couples the first sidewall to the second sidewall; the source extends a distance along the first sidewall, the distance: (a) measured parallel to the short axis, and (b) being at least 2 nm and no more than 35 nm from the third sidewall.

Example 22A

A system comprising: a memory; and a processor coupled to the memory, wherein at least one of the processor and the memory include the integrated circuit device according to example 1A.

Example 23A

A method comprising: forming a gate stack, the gate stack including: (a)(i) a layer comprising a semiconductor material, (a)(ii) a gate dielectric on the layer, (a)(iii) first and second spacers on the layer, and (a)(iv) a gate on the gate dielectric; forming first and second voids within the layer and on opposing sides of the gate stack, a channel region being located within the layer between the first and second voids; using lateral epitaxial growth to form a source region within the first void and a drain region within the second void; forming a source contact corresponding to the source region and a drain contact corresponding to the drain region; wherein (b)(i) the layer is included in a fin, (b)(ii) the channel includes a long axis and a short axis; (b)(iii) an additional axis intersects the source contact, the source, the drain, and the drain contact, and (b)(iv) the additional axis is parallel to the long axis.

Example 24A

The method of example 23A wherein the long axis intersects the source contact, the channel, and the drain contact.

Embodiments addressed above are applicable to MOSFETs, TFETs, and other switching devices. Source regions may include Si, C, Sn, Ge, In, Al, Ga, P, As, Sb, Bi or suitable combinations thereof (e.g., SiGe, InGaAs, InP, InAs, GaN). Drain regions may include Si, C, Sn, Ge, In, Al, Ga, P, As, Sb, Bi or suitable combinations thereof (e.g., SiGe, InGaAs, InP, InAs, GaN). Channel regions may include Si, C, Sn, Ge, In, Al, Ga, P, As, Sb, Bi or suitable combinations thereof (e.g., SiGe, InGaAs, InP, InAs, GaN). Dielectric materials may include various oxides, nitrides, or suitable combinations thereof. Contacts (e.g., for S/D regions) may include copper, ruthenium, palladium, platinum, cobalt, nickel, ruthenium oxide, tungsten, aluminum, titanium, tantalum, titanium nitride, tantalum nitride, hafnium, zirconium, a metal carbide, a conductive metal oxide, or suitable combinations thereof.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An integrated circuit device comprising:
   a transistor including an epitaxial source, a channel, and an epitaxial drain;
   a fin that includes the channel, the channel including a long axis and a short axis;
   a source contact corresponding to the source; and
   a drain contact corresponding to the drain;
   wherein (a) an additional axis intersects the source contact, the source, the drain, and the drain contact, and (b) the additional axis is parallel to the long axis;
   wherein the source contact includes a first sidewall and a second sidewall and the additional axis intersects the first and second sidewalls;
   wherein the additional axis intersects the source at a location and the location is between the first and second sidewalls.

2. The integrated circuit device of claim 1 comprising a gate corresponding to the channel, wherein the additional axis intersects the gate.

3. The integrated circuit device of claim 2 comprising a first spacer on a first side of the gate and a second spacer on a second side of the gate, the additional axis intersecting the first and second spacers.

4. The integrated circuit device of claim 3 comprising a silicide between the source contact and the source, the additional axis intersecting the silicide.

5. The integrated circuit device of claim 3 comprising a gate dielectric between the channel and the gate, wherein the additional axis intersects the gate dielectric.

6. The integrated circuit device of claim 3 wherein:
   the first spacer includes first and second spacer sidewalls;
   the first sidewall is between the second spacer sidewall and the source;
   the source includes at least one of silicon, a group IV element, or combinations thereof; and
   the source extends a length, the length: (a) measured parallel to the long axis and from the first spacer sidewall, and (b) being no more than 12 nm.

7. The integrated circuit device of claim 6 wherein:
   the first spacer includes a third spacer sidewall that couples the first spacer sidewall to the second spacer sidewall;
   the source extends a distance along the first spacer sidewall, the distance: (a) measured parallel to the short axis, and (b) being at least 2 nm and no more than 6 nm from the third spacer sidewall.

8. The integrated circuit device of claim 3 wherein:
   the first spacer includes first and second spacer sidewalls;
   the first spacer sidewall is between the second spacer sidewall and the source;
   the source includes a group III material and a group V material; and
   the source extends a length, the length: (a) measured parallel to the long axis and from the first spacer sidewall, and (b) being no more than 35 nm.

9. The integrated circuit device of claim 8 wherein:
   the first spacer includes a third sidewall that couples the first spacer sidewall to the second spacer sidewall;
   the source extends a distance along the first spacer sidewall, the distance: (a) measured parallel to the short axis, and (b) being at least 2 nm and no more than 35 nm from the third spacer sidewall.

10. The integrated circuit device of claim 2 wherein the source includes a group III material and a group V material.

11. The integrated circuit device of claim 2 wherein the source includes a group IV material.

12. A system comprising:
    a memory; and
    a processor coupled to the memory,
    wherein at least one of the processor and the memory include the integrated circuit device according to claim 1.

13. An apparatus comprising:
    a transistor including an epitaxial source, a channel, and an epitaxial drain;
    a fin that includes the channel, the channel including a long axis and a short axis;
    a source contact corresponding to the source;
    a drain contact corresponding to the drain;
    a gate corresponding to the channel;
    a gate dielectric on the gate; and
    a first spacer on a first side of the gate and a second spacer on a second side of the gate;
    wherein (a) an additional axis intersects the source contact, the drain contact, the first and second spacers, the gate dielectric, and the gate, (b) the additional axis is parallel to the long axis; (c) a single plane includes the short axis, the long axis, and the additional axis, and (d) the short axis intersects the gate at first and second locations and the channel is between the first and second locations.

14. The apparatus of claim 13 wherein:
    the first spacer includes first and second sidewalls;
    the first sidewall is between the second sidewall and the source;
    the source includes at least one of silicon, a group IV material, or combinations thereof; and
    the source extends a length, the length: (a) measured parallel to the long axis and from the first sidewall, and (b) being no more than 12 nm.

15. The apparatus of claim 14 wherein:
    the first spacer includes a third sidewall that couples the first sidewall to the second sidewall;
    the source extends a distance along the first sidewall, the distance: (a) measured parallel to the short axis, and (b) being at least 2 nm and no more than 6 nm from the third sidewall.

16. The apparatus of claim 14 wherein:
    the first spacer includes first and second sidewalls;
    the first sidewall is between the second sidewall and the source;
    the source includes a group III material and a group V material; and
    the source extends a length, the length: (a) measured parallel to the long axis and from the first sidewall, and (b) being no more than 35 nm.

17. The apparatus of claim 16 wherein:
    the first spacer includes a third sidewall that couples the first sidewall to the second sidewall;
    the source extends a distance along the first sidewall, the distance: (a) measured parallel to the short axis, and (b) being at least 2 nm and no more than 35 nm from the third sidewall.

18. The apparatus of claim 13, wherein the long axis intersects the source contact, the channel region, and the drain contact.

19. The apparatus of claim 18 comprising a silicide between the source contact and the source region, the long axis intersecting the silicide.

20. The apparatus of claim 13, wherein:
the source contact includes a first sidewall and a second sidewall;
the additional axis intersects the first and second sidewalls.

21. The apparatus of claim 20 wherein:
the additional axis intersects the source at a third location;
the third location is between the first and second sidewalls.

22. A method comprising:
forming a gate stack, the gate stack including: (a)(i) a layer comprising a semiconductor material, (a)(ii) a gate dielectric on the layer, (a)(iii) first and second spacers on the layer, and (a)(iv) a gate on the gate dielectric;
forming first and second voids within the layer and on opposing sides of the gate stack, a channel region being located within the layer between the first and second voids;
using lateral epitaxial growth to form a source region within the first void and a drain region within the second void;
forming a source contact corresponding to the source region and a drain contact corresponding to the drain region;
wherein (b)(i) the layer is included in a fin, (b)(ii) the channel includes a long axis and a short axis; (b)(iii) an additional axis intersects the source contact, the source region, the drain region, and the drain contact, (b)(iv) the additional axis is parallel to the long axis, (b)(v) a single plane includes the short axis, the long axis, and the additional axis, and (b)(vi) the short axis intersects the gate at first and second locations and the channel is between the first and second locations.

23. The method of claim 22 wherein the long axis intersects the source contact, the channel region, and the drain contact.

* * * * *